US012054288B2

(12) United States Patent
Grabner et al.

(10) Patent No.: US 12,054,288 B2
(45) Date of Patent: Aug. 6, 2024

(54) GPU FOR THE PROVISION OF ELECTRICAL ENERGY FOR AIRCRAFT

(71) Applicant: Dynell GmbH, Mistelbach bei Wels (AT)

(72) Inventors: Herbert Grabner, Mistelbach bei Wels (AT); Philipp Moser, Mistelbach bei Wels (AT); Christian Raschko, Mistelbach bei Wels (AT)

(73) Assignee: Dynell GmbH, Mistelbach bei Wels (AT)

(*) Notice: Subject to any disclaimer, the term of this patent is extended or adjusted under 35 U.S.C. 154(b) by 219 days.

(21) Appl. No.: 17/635,492

(22) PCT Filed: Sep. 17, 2020

(86) PCT No.: PCT/AT2020/060338
§ 371 (c)(1),
(2) Date: Feb. 15, 2022

(87) PCT Pub. No.: WO2021/062455
PCT Pub. Date: Apr. 8, 2021

(65) Prior Publication Data
US 2022/0340302 A1    Oct. 27, 2022

(30) Foreign Application Priority Data
Oct. 2, 2019   (AT) .............................. A 50835/2019

(51) Int. Cl.
*H02M 7/00*   (2006.01)
*B64F 1/36*   (2017.01)
(Continued)

(52) U.S. Cl.
CPC ............... *B64F 1/362* (2013.01); *H02B 1/26* (2013.01); *H02M 7/003* (2013.01); *B64F 3/02* (2013.01); *H02M 7/493* (2013.01)

(58) Field of Classification Search
None
See application file for complete search history.

(56) References Cited

U.S. PATENT DOCUMENTS 5,412,557 A * 5/1995 Lauw .................. H02M 7/4826
                                                          363/40
5,726,506 A    3/1998 Wood
(Continued)

FOREIGN PATENT DOCUMENTS

DE        3423867 A1    1/1986
DE       10043747 A1    3/2002
(Continued)

OTHER PUBLICATIONS

International Search Report in PCT/AT2020/060338, mailed Jan. 19, 2021.

*Primary Examiner* — Courtney L Smith
(74) *Attorney, Agent, or Firm* — Collard & Roe, P.C.

(57) ABSTRACT

A ground power unit provides electrical energy for aircraft and a method maintains and operates the ground power unit. The ground power unit includes a base frame, a cable system formed in the base frame, at least one rectifier module for converting an input alternating voltage applied to a rectifier module input side into an intermediate direct voltage output at a rectifier module output side, wherein the rectifier module output side is coupled to an intermediate circuit conductor and at least one inverter module for converting the intermediate direct voltage applied to an inverter module input side into an output alternating current output at an inverter module output side, wherein the inverter module input side is coupled to an intermediate circuit conductor. The rectifier module and the inverter module are each realized as structurally-independent units, which can be replaced individually and independently of the base frame.

13 Claims, 3 Drawing Sheets

Figure 1:
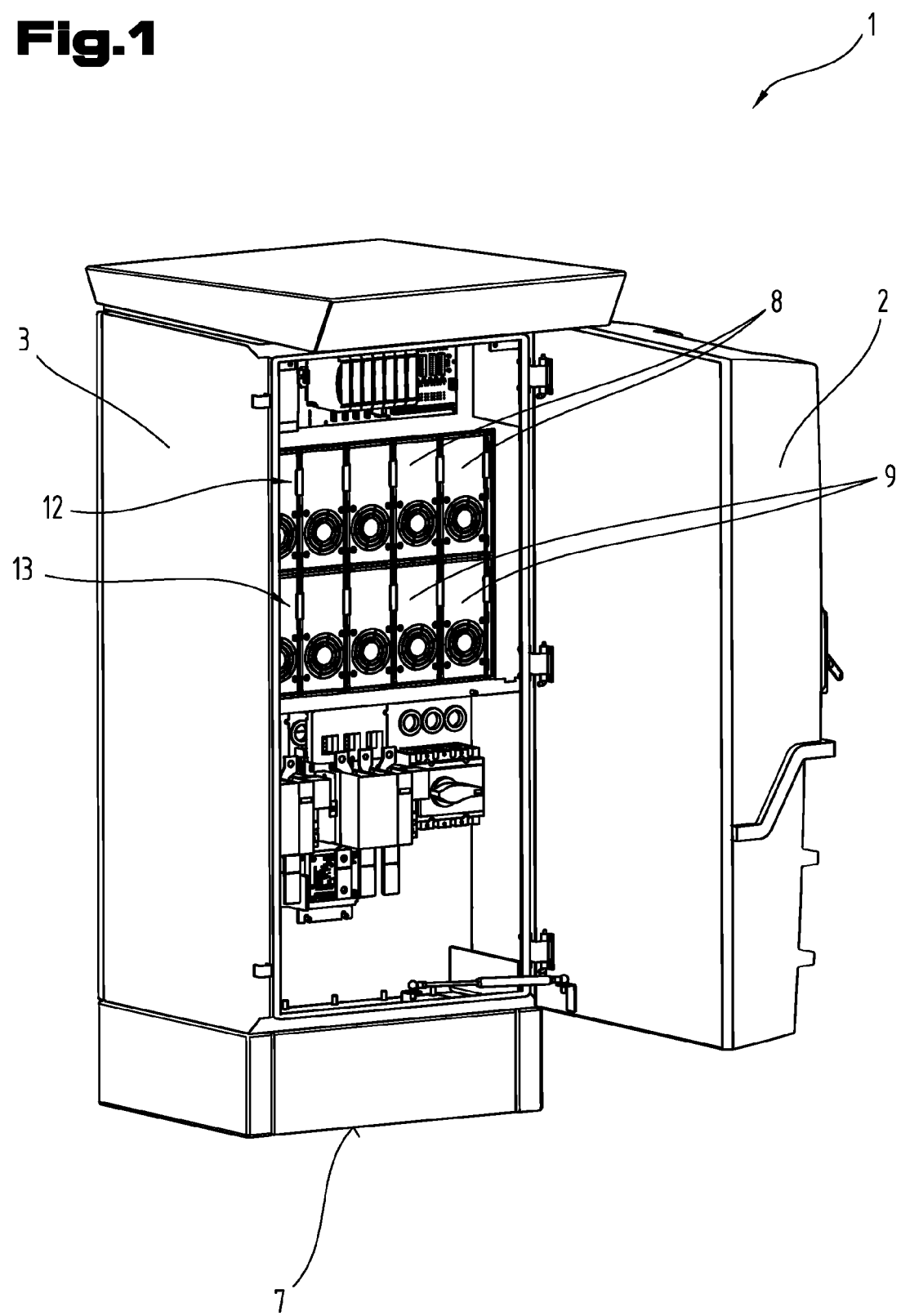

(51) Int. Cl.
  *B64F 3/00* (2006.01)
  *H02B 1/26* (2006.01)
  *B64F 3/02* (2006.01)
  *H02M 7/493* (2007.01)

(56) References Cited

U.S. PATENT DOCUMENTS

| | | |
|---|---|---|
| 8,047,555 B2 | 11/2011 | Mann, III et al. |
| 2008/0053716 A1* | 3/2008 | Scheucher .......... H01M 50/204 |
| | | 320/124 |
| 2011/0316332 A1 | 12/2011 | Karnatz et al. |
| 2013/0322016 A1 | 12/2013 | Jones et al. |
| 2015/0130186 A1* | 5/2015 | Vieillard ................. F02N 11/04 |
| | | 290/31 |
| 2019/0152617 A1* | 5/2019 | Anton .................... B64D 31/00 |
| 2020/0083717 A1* | 3/2020 | Pouliquen ................ H02J 4/00 |
| 2021/0075333 A1* | 3/2021 | Rivas-Davila .... H02M 3/33592 |

FOREIGN PATENT DOCUMENTS

| | | |
|---|---|---|
| EP | 0 134 554 A1 | 3/1985 |
| EP | 2 399 769 A2 | 12/2011 |
| EP | 2 212 203 B1 | 7/2012 |
| EP | 3 065 260 A1 | 9/2016 |
| WO | 2005/124990 A2 | 12/2005 |
| WO | 2018/005451 A1 | 1/2018 |

\* cited by examiner

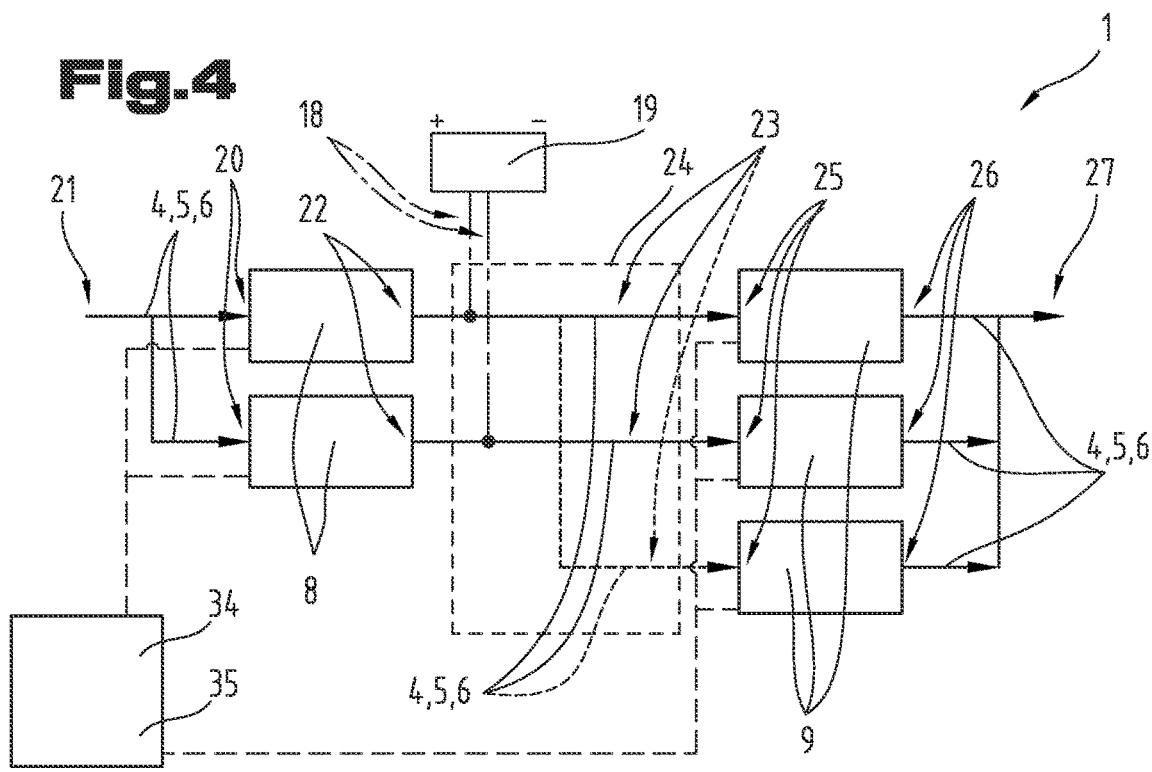
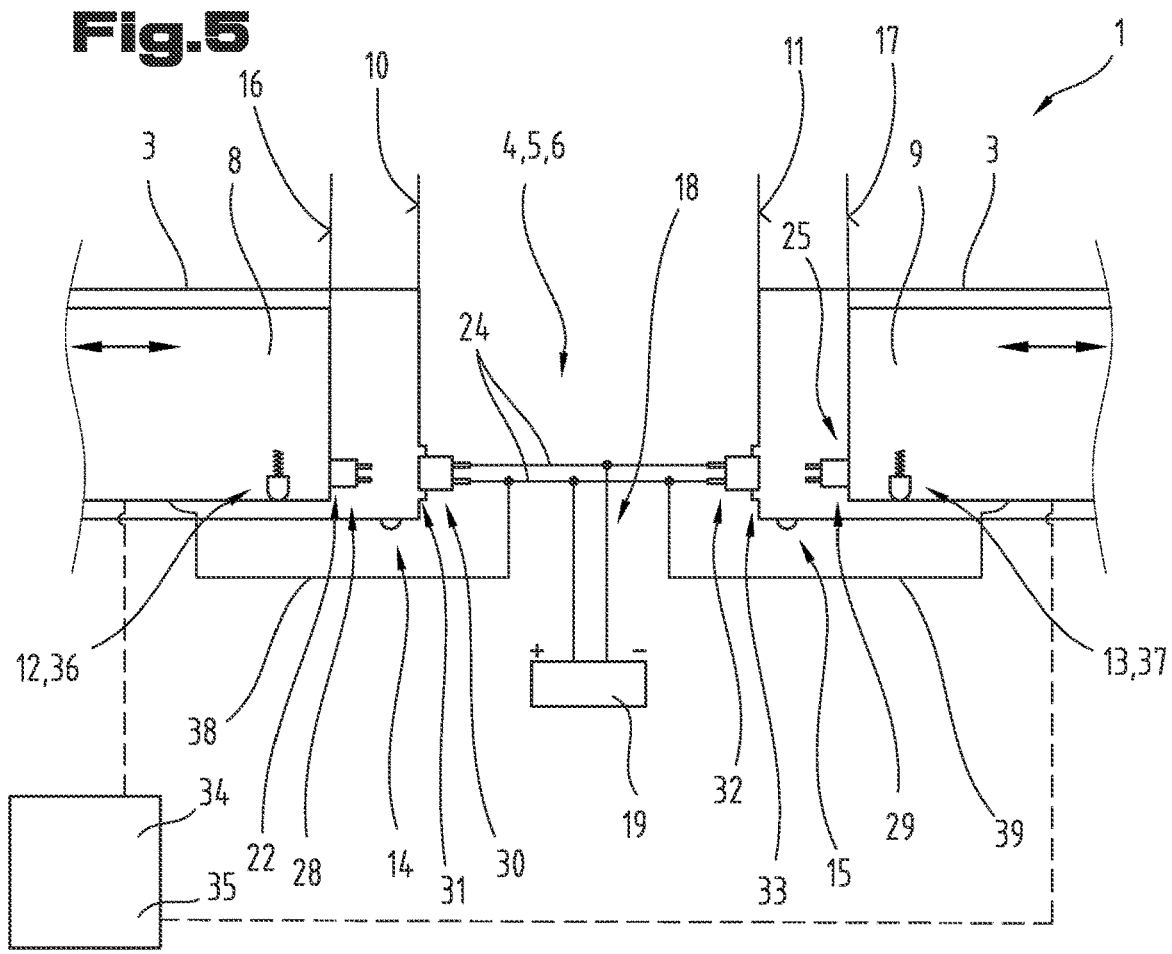

GPU FOR THE PROVISION OF ELECTRICAL ENERGY FOR AIRCRAFT

CROSS REFERENCE TO RELATED APPLICATIONS

This application is the National Stage of PCT/AT2020/060338 filed on Sep. 17, 2020, which claims priority under 35 U.S.C. § 119 of Austrian Application No. A50835/2019 filed on Oct. 2, 2019, the disclosure of which is incorporated by reference. The international application under PCT article 21(2) was not published in English.

The invention relates to a ground power unit for providing electrical energy for aircraft and a method for maintaining and operating the ground power unit according to the invention.

According to the prior art, the functions of a ground power unit are realized in an entirety, both electronically and structurally. In this regard, all power electronic components are installed in a control cabinet. This entails the advantage that the components can be replaced only in a time-consuming manner and using special tools. In addition, a replacing operation usually involves great expenditures.

From EP 2212203 A1, a ground support equipment cart, which comprises one or multiple rectangular equipment modules, which are installed on the car in a removable manner, wherein at least one or multiple of the removable modules contain electrical power converter components. The cart further comprises a first rectangular module, which contains airplane air conditioning components, which are mounted on the cart, and extends over the width of the cart, but essentially takes up less than half of the length of the cart, and a second rectangular module, which contains power converter components, which are mounted on the cart, and takes up essentially the rest of the cart.

WO 2018005451 A1 discloses an integrated, mobile ground support system, which comprises a cart provided with wheels, on which cart a power plant is mounted for powering an air compressor for supplying an airplane with bleed air. The power plant also powers an electrical generator, the power of which is controlled and converted into alternating and/or direct current for covering the power requirement of the airplane. An air conditioning unit is also mounted on the cart for supplying the airplane with conditioned air.

The object of the present invention was to overcome the shortcomings of the prior art and to provide a device and a method, which enable a simple maintenance of a ground power unit.

This object is achieved by means of a device and a method according to the claims.

The invention relates to a ground power unit for providing electrical energy for aircraft, the ground power unit comprising:
 a base frame;
 a cable system, which is formed in the base frame;
 at least one rectifier module for converting an input alternating voltage applied to a rectifier module input side into an intermediate direct voltage output at a rectifier module output side, wherein the rectifier module output side is coupled to an intermediate circuit conductor;
 at least one inverter module for converting the intermediate direct voltage applied to an inverter module input side into an output alternating current which is output at an inverter module output side, wherein the inverter module input side is coupled to an intermediate circuit conductor. Furthermore, the rectifier module and the inverter module are each realized as units formed to be structurally independent, which can be replaced individually and independently of the base frame.

A ground power unit of such a design enables the user in an advantageous manner to replace individual rectifier modules and inverter modules in an easy, quick, and economic manner compared to the known embodiments. This may be required, particularly if individual modules are defective. The structural separation of the modules results in units of lower weight and smaller outer dimensions, which additionally facilitates the replacement. Furthermore, it is advantageous that only the defective components can be replaced. Thereby, an environmentally friendly and resource-efficient ground power unit is provided. Additionally, the modules can be produced at a comparatively lower cost.

Furthermore, it may be useful if the rectifier module and the inverter module have the same structural design, in particular if the rectifier module and the inverter module are coupled to the cable system in a mirrored manner as viewed in the direction of the electric flow. In this regard, the structurally identical modules are different only in their control software. This embodiment is particularly advantageous insofar as structurally identical components are more cost-effective to produce and thus, offer the user a cost advantage. Additionally, a lower number of spare parts is required and as a result, an easier storage of spare parts is possible. This ensures that in case of defective modules, spare modules are quickly available.

Furthermore, it may be provided that the rectifier module and the inverter module each have at least one plug, each of which is coupled to a mating plug connected to the cable system in an electrically conductive manner Plug connections advantageously make a connection which is releasable and/or can be established easily and in particular without the use of tools possible. Usually, the requirements for such connection mechanisms in regard to the level of education and experience of the maintenance personnel are low. This way, even non-experienced users can perform appropriate maintenance work after a limited training phase.

Furthermore, it may be provided that the plug is arranged on the rectifier module and/or on the inverter module, and the mating plug is arranged in the region of a receiving recess on the base frame such that, in an operating position of the rectifier module and/or of the inverter module, an electrically conductive connection between the plug and the mating plug is established. Thus, an electrically conductive connection can be established without additional effort and/or without an additional working step. Furthermore, the electrically conductive connection is automatically disconnected when the module is transferred from the operating position into a changing position. This contributes substantially to the safety of the user as the risk of electric shocks is reduced. Furthermore, the use and/or the maintenance of the ground power unit according to the invention does not require a high level of education and experience from the maintenance personnel, as mentioned before.

An embodiment, according to which it may be provided that the rectifier module and the inverter module have a quick-release connector, which is designed such that it engages with a quick-release connector mating element in the base frame and/or locks automatically upon transfer into the operating position, is also advantageous. By providing such a locking arrangement, it is made possible to establish a connection between the modules and the base frame, which can be established automatically and also without the use of tools. Moreover, this embodiment contributes to the increase of user safety during the changing operation as the automatic engaging and/or locking largely prevents an undesired release and/or falling out of the modules.

According to an advancement, it is possible that the rectifier module and the inverter module are positioned at a height of 0.5 m to 2.0 m, particularly preferably at a height of 0.6-1.8 m, with respect to a ground contact area of the base frame. Thus, a working height that is ergonomic for the user is provided for the changing operation. This advancement therefore has a positive effect on the duration of the operation while simultaneously increasing comfort and safety for the user.

Furthermore, it may be useful if the rectifier module and the inverter module are each installed on only one circuit board. This embodiment offers the advantage of a compact design and a serial production that can be conducted in a cost-effective manner.

Moreover, it may be provided that at least two rectifier modules are formed, which are electrically connected in parallel with one another, and/or that at least two inverter modules are formed, which are electrically connected in parallel with one another. The circumstance that the same functions are carried out in parallel thereby results in an extremely advantageous redundancy effect. In further consequence, this embodiment equally causes a flexibilization of the application possibilities and an increase of the system availability.

Furthermore, it may be provided that a load distribution system is formed, which is configured such that a load distribution between the rectifier modules and/or the inverter modules can be carried out in an automated manner. This way, the system can react flexibly to load requirements. In this regard, the load distribution system may be designed as part of a main computer.

In particular, it may be advantageous if one of multiple rectifier modules connected in parallel with one another and/or one of multiple inverter modules connected in parallel with one another can be disconnected in the part-load operational range. Thereby, the degrees of efficiency in these load points can be increased advantageously. The disconnection may take place, for example, automatically by means of the load distribution system and/or the main computer, or also be actively initialized by a user.

According to a particular embodiment, it is possible that the rectifier module and/or the inverter module have a data interface, which is configured for an exchange of information with each other, meaning between the modules, and/or with a main computer. The embodiment ensures an increased degree of flexibility for the user and increases the range of applications of the ground power unit advantageously.

According to an advantageous advancement, it may be provided that the data interface is a digital data interface, and that both the rectifier module and the inverter module are each assigned an address or can be assigned an address, wherein the at least one rectifier module and the at least one inverter module preferably receives the address via the plug. Digital interfaces generally offer the advantage of a flexible data exchange. Additionally, it is advantageous if the required addresses are automatically assigned via the plug connection and therefore, no further connections have to be created. Thus, this contributes to the decrease of the structural complexity.

Moreover, it may be provided that the intermediate circuit conductor is coupled to a parallel input, by means of which additional direct current power sources, such as batteries or accumulators, can be integrated into the intermediate circuit conductor. By providing this advancement, the application possibilities of the ground power unit are advantageously expanded and/or flexibilized. Furthermore, by this means, hybrid ground power supplies can be realized in a simple manner. Alternatively or additionally to the line voltage and/or input alternating voltage at the rectifier module, an energy supply can take place via the intermediate circuit interface. Preferably, battery storage devices, hydrogen fuel cells, and diesel generator sets are used for this. Overall, this advancement can be used for reducing the peak network load. Furthermore, it is also possible to operate the ground power unit independently of a network connection. Hereby, the range of applications of the ground power unit according to the invention is additionally increased and/or flexibilized.

Additionally, it may be provided that a discharging device is formed and arranged in the base frame and/or in the rectifier module and/or in the inverter module such that, upon transfer from the operating position into a changing position, the electrical energy stored in the rectifier module and/or in the inverter module is automatically discharged. In particular, discharge resistors can be connected here via relay or semiconductor. By means of this embodiment, the safety level for the user during the changing operation can be increased as the risk of electric shocks is decreased.

A method for maintaining and operating a ground power unit for providing electrical energy for aircraft, in particular a ground power unit according to the embodiments explained above, is also advantageous. The ground power unit comprises:
- a base frame;
- a cable system, which is formed in the base frame;
- at least one rectifier module for converting an input alternating voltage applied to a rectifier module input side into an intermediate direct voltage output at a rectifier module output side, wherein the rectifier module output side is coupled to an intermediate circuit conductor;
- at least one inverter module for converting the intermediate direct voltage applied to an inverter module input side into an output alternating current which is output at an inverter module output side, wherein the inverter module input side is coupled to an intermediate circuit conductor. Moreover, in this method, a replacing of the rectifier module and/or of the inverter module is provided, wherein they are each realized as units formed to be structurally independent, which are replaced individually and independently of the base frame.

A method of such a design enables the user in an advantageous manner to replace individual rectifier modules and inverter modules in an easy, quick, and economic manner compared to the known embodiments. This may be required, particularly if individual modules are defective. The structural separation of the modules results in units of lower weight and smaller outer dimensions, which additionally facilitates the replacement. Furthermore, it is advantageous that only the defective components can be replaced. Thereby, an environmentally friendly and resource-efficient ground power unit is provided. Additionally, the modules can be produced at a comparatively lower cost.

According to an advancement, it is possible that the rectifier module and/or the inverter module is coupled to a main computer, wherein the main computer disconnects a defective rectifier module and/or inverter module and adjusts the load distribution to the remaining rectifier modules and/or inverter modules. Preferably, the load distribution is performed by the load distribution system. This advancement is advantageous insofar as an outage of a module, for example following a fault, is recognized by the main computer and this outage is compensated by an automatic distribution of the total load to the remaining number of modules. Thus, the system availability is increased, and the economy of the operation is improved.

Furthermore, it is advantageous if at least one of multiple rectifier modules connected in parallel with one another and/or at least one of multiple inverter modules connected in parallel with one another is disconnected in the part-load operational range. Thereby, the degrees of efficiency in these load points can be increased advantageously. The disconnection may take place, for example, automatically by means of the load distribution system and/or the main computer, or also be actively initialized by a user.

A cable system within the meaning of this document may comprise electrical connections in the form of circuit boards and/or cable harnesses.

Additionally, it may be provided that multiple of the rectifier modules are arranged next to one another in the horizontal direction, and/or that multiple of the inverter modules are arranged next to one another in the horizontal direction. Moreover, it may be provided that the rectifier modules and the inverter modules are arranged above one another in the vertical direction. Furthermore, it may be advantageous if multiple rectifier modules and inverter modules are arranged next to one another in one plane. These measures facilitate replacing the modules and additionally improve the air conveyance to the cooling system.

Advantageously, it may be provided that the rectifier modules and inverter modules are installed on circuit boards made from semiconductors, wherein the semiconductors comprise silicon carbide.

It is also advantageous if the rectifier modules are equipped with an active power factor correction filter.

In particular, it may be useful if the rectifier modules and inverter modules are configured to convert a three-phase input alternating voltage into a three-phase output alternating voltage. The input alternating voltage may be variable in its amplitude and frequency. Preferably a three-phase input alternating voltage of 3×400 V/50 Hz, 3×480 V/60 Hz, 960 V/50 Hz, or 690 V/50 Hz is converted into a three-phase output alternating voltage of 3×200 V/400 Hz. In this case, the inverter module typically supplies an output voltage that is higher than the input voltage. Preferably, an output transformer for adjusting the voltage is installed downstream. Of course, it is also conceivable that one output transformer is arranged on each inverter module. Furthermore, it is conceivable that the three-phase input alternating voltage of 3×400 V/50 Hz, 3×480 V/60 Hz, 960 V/50 Hz, or 690 V/50 Hz is converted into an output direct voltage of 28 V DC or 270 V DC. For this purpose, the input alternating voltage is rectified by means of the rectifier modules. The direct current generated thereby serves, in further consequence, as the input voltage for a DC-to-DC converter. The inverter module may, in this regard, be designed as part of the DC-to-DC converter or may also assume the entire function of the DC-to-DC converter.

For the purpose of better understanding of the invention, it will be elucidated in more detail by means of the figures below.

Figure 2:
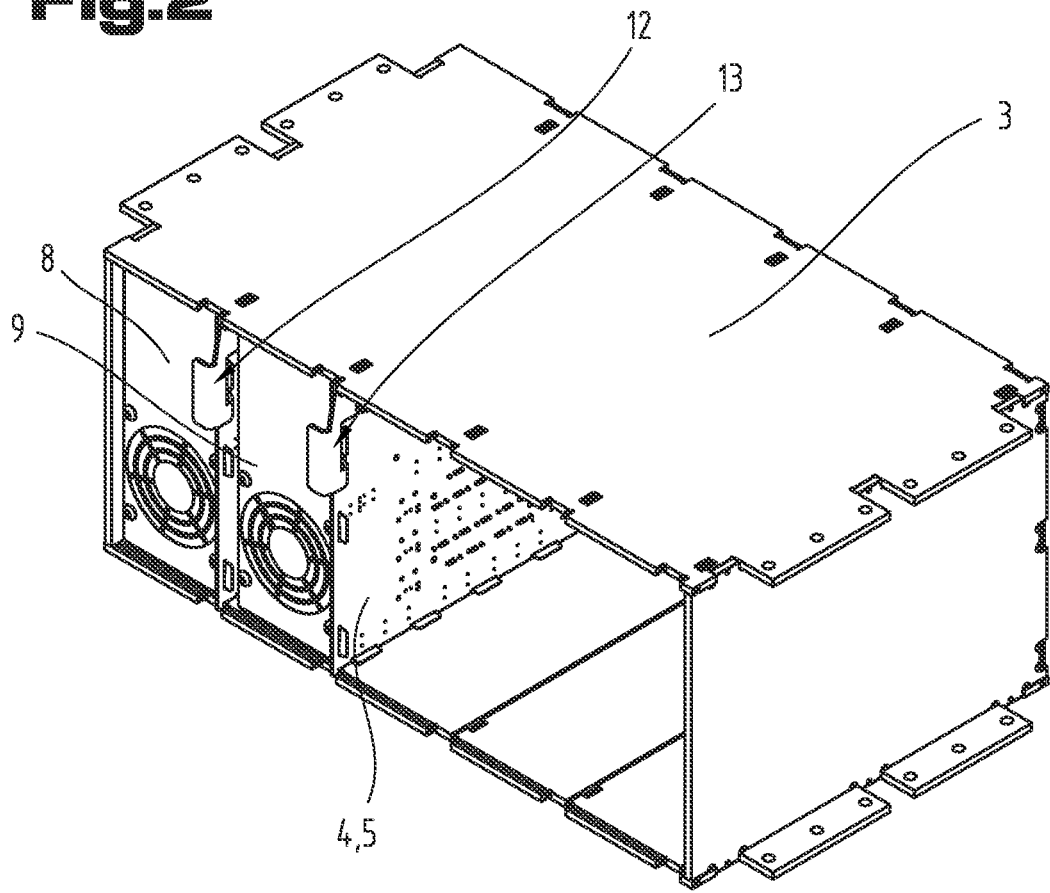
Figure 3:
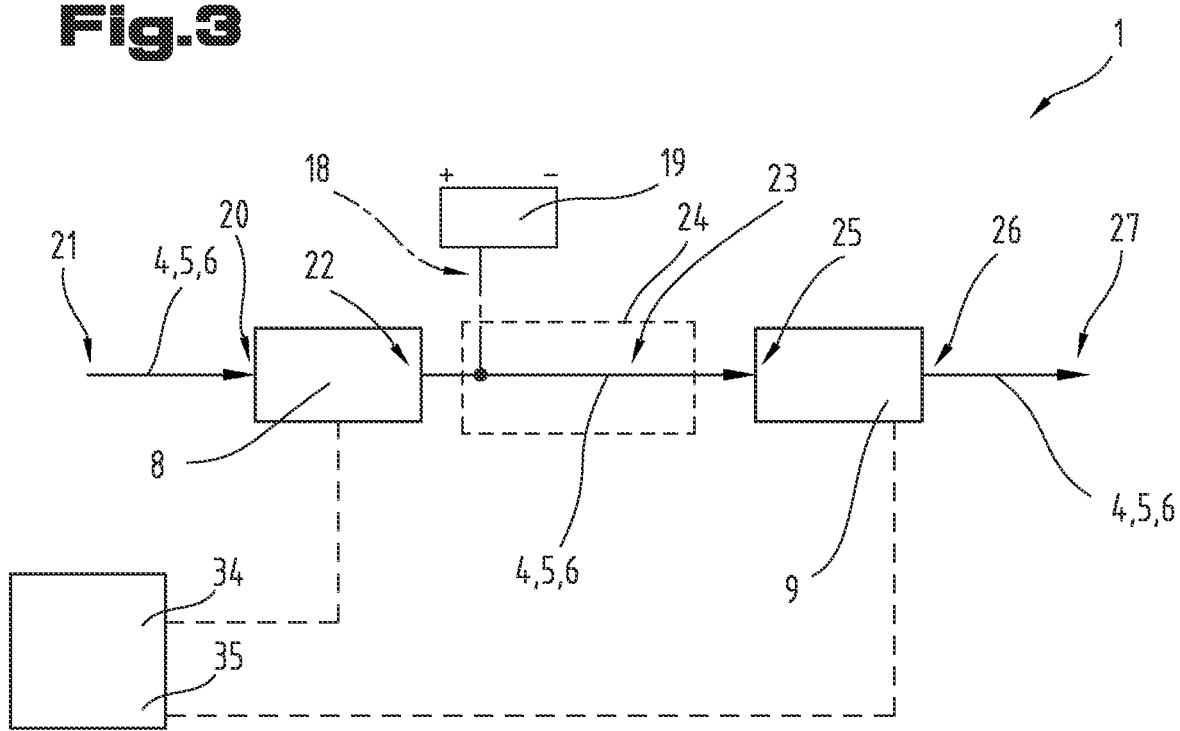

These show in a respectively very simplified schematic representation:

FIG. 1 an isometric view of an embodiment of the ground power unit with an opened protective cover;

FIG. 2 an isometric view of two rectifier modules and/or inverter modules;

FIG. 3 a first block diagram of a possible arrangement of one rectifier module and one inverter module each in a ground power unit;

FIG. 4 a second block diagram of a further possible arrangement of two rectifier modules and three inverter modules in a ground power unit;

FIG. 5 a schematic representation of a rectifier module and an inverter module.

First of all, it is to be noted that in the different embodiments described, equal parts are provided with equal reference numbers and/or equal component designations, where the disclosures contained in the entire description may be analogously transferred to equal parts with equal reference numbers and/or equal component designations. Moreover, the specifications of location, such as at the top, at the bottom, at the side, chosen in the description refer to the directly described and depicted figure and in case of a change of position, these specifications of location are to be analogously transferred to the new position.

Subsequently, the ground power unit 1 and/or its components and functions is described with the aid of a combination of FIGS. 1 to 5.

FIG. 1 shows an isometric view of a possible embodiment of the ground power unit 1 with an opened protective cover 2.

The ground power unit 1 comprises a base frame 3 and a cable system 4 formed in the base frame 3. In this regard, this cable system 4 may comprise electrical connections in the form of circuit boards 5 and/or cable harnesses 6. It should be noted that the cable system 4, the circuit boards 5, and the cable harnesses 6 are shown schematically in FIGS. 3 and 4.

In the exemplary embodiment according to FIG. 1, five rectifier modules 8 and five inverter modules 9 each are arranged at a working height ergonomic for the user, which height is advantageously situated at a height of 0.5 m to 2.0 m, particularly preferably at a height of 0.6-1.8 m, with respect to a ground contact area 7. As can be seen in FIG. 1, it may be provided that multiple of the rectifier modules 8 are arranged next to one another in the horizontal direction, and/or that multiple of the inverter modules 9 are arranged next to one another in the horizontal direction. Moreover, it may also be provided that the rectifier modules 8 and the inverter modules 9 are arranged above one another in the vertical direction.

In an alternative embodiment variant that is not shown, it may of course also be provided that multiple rectifier modules 8 and inverter modules 9 are arranged next to one another in one plane.

This facilitates replacing the modules 8, 9 and additionally improves the air conveyance to the cooling system.

In this regard, the rectifier modules 8 and inverter modules 9 are each realized as units formed to be structurally independent. These units can be replaced individually and independently of one another of the base frame 3. The rectifier modules 8 and inverter modules 9 are shown in FIG. 1 in an operating position 10, 11, wherein the location of the operating position 10, 11 can be seen in detail particularly in FIG. 5. Moreover, it may be provided that the rectifier modules 8 and inverter modules 9 have the same structural design and are coupled to the cable system 4, which is not shown, in a mirrored manner as viewed in the direction of the electric flow.

Moreover, FIG. 1 shows parts of a quick-release connector 12, 13, which are arranged on the rectifier modules 8 and inverter modules 9.

FIG. 2 shows an isometric view of two rectifier modules 8 and/or inverter modules 9, arranged in a section of the base frame 3. Here, equal reference numbers and/or component designations are used for equal parts as in FIG. 1 preceding it. In order to avoid unnecessary repetitions, it is therefore pointed to/reference is made thus to the detailed description in FIG. 1 preceding it.

In the exemplary embodiment shown, a rectifier module 8 is arranged next to an inverter module 9, however, any other arrangement variant is also possible. For example, it may be provided that multiple of the rectifier modules 8 are arranged next to one another in the horizontal direction, and/or that multiple of the inverter modules 9 are arranged next to one another in the horizontal direction. Moreover, it may also be provided that the rectifier modules 8 and the inverter modules 9 are arranged above one another in the vertical direction.

In an alternative embodiment variant that is not shown, it may of course also be provided that multiple rectifier modules 8 and inverter modules 9 are arranged next to one another in one plane.

Advantageously, the rectifier modules 8 and inverter modules 9 are installed on circuit boards 5 made from semiconductors, wherein the semiconductors comprise silicon carbide.

In the section of the base frame 3 shown in FIG. 2, it is possible to provide up to five rectifier modules 8 and/or inverter modules 9.

Moreover, the quick-release connector 12, 13 may be realized on the rectifier modules 8 and inverter modules 9, which quick-release connector 12, 13 is configured such that it engages with the base frame 3 and/or locks automatically upon transfer into the operating position 10, 11.

The rectifier modules 8 and inverter modules 9 may each be installed on just one circuit board 5.

FIGS. 3 and 4 each show a block diagram of different conceivable arrangements of rectifier modules 8 and inverter module 9 in a ground power unit 1.

FIG. 3 shows, in particular, a first block diagram of a possible arrangement of one rectifier module 8 and one inverter module 9 each in a ground power unit 1.

FIG. 3 shows that an input alternating voltage 21 is applied to the rectifier module input side 20 of the rectifier module 8. In the rectifier module 8, the input alternating voltage 21 is converted into an intermediate direct voltage 23. A rectifier module output side 22 of the rectifier module 8 is coupled to an intermediate circuit conductor 24, to which the intermediate direct voltage 23 is supplied.

The inverter module 9 serves to convert the intermediate direct voltage 23 into an output alternating voltage 27. Here, the intermediate direct voltage 23 is applied to the inverter module input side 25. The output alternating voltage 27 exits the inverter modules 9 at the inverter module output side 26.

The intermediate circuit conductor 24 can be coupled to a parallel input 18 as needed, by means of which additional direct current power sources 19, such as batteries or accumulators, can be integrated into the intermediate circuit conductor 24.

FIG. 4 shows a second block diagram of a further possible arrangement of two rectifier modules 8 and three inverter modules 9 in a ground power unit 1. However, it is of course also possible that a different number of rectifier modules 8 and/or inverter modules 9 is provided. In particular, it may be provided that the number of rectifier modules 8 and the number of inverter modules 9 in the ground power unit 1 is the same.

FIG. 4 shows that the input alternating voltage 21 is applied to the rectifier module input sides 20 of the two rectifier modules 8. In the rectifier modules 8, the input alternating voltage 21 is converted into the intermediate direct voltage 23. The two rectifier module output sides 22 of the rectifier modules 8 are coupled to the intermediate circuit conductor 24, to which the intermediate direct voltage 23 is supplied.

The three inverter modules 9 shown serve to convert the intermediate direct voltage 23 into the output alternating voltage 27. Here, the intermediate direct voltage 23 is applied to the inverter module input sides 25. The output alternating voltage 27 exits the inverter modules 9 at the inverter module output sides 26.

As already explained in the context of FIG. 3, the intermediate circuit conductor 24 can be coupled to a parallel input 18 as needed, by means of which additional direct current power sources 19, such as batteries or accumulators, can be integrated into the intermediate circuit conductor 24.

In the present exemplary embodiment of FIG. 4, the two rectifier modules 8 shown are electrically connected in parallel with one another. The same applies to the three inverter modules 9, which may also be electrically connected in parallel with one another.

In FIG. 4, it can moreover be seen that a load distribution system 35 may be configured such that a load distribution between the rectifier module 8 and/or between the inverter modules 9 may take place in an automated manner. The load distribution between the rectifier modules 8 and/or between the inverter modules 9 may, in this regard, take place by means of a main computer 34.

In the part-load operational range, individual rectifier modules 8 and/or inverter modules 9 can be disconnected. This may preferably take place by means of the main computer 34.

It may be useful if the rectifier modules 8 and inverter modules 9 are coupled to the main computer 34. This main computer 34 may recognize one or also multiple defective rectifier modules 8 or one or multiple defective inverter modules 9 and can, in further consequence, automatically disconnect them. The load distribution may be adjusted to the remaining rectifier modules 8 and/or inverter modules 9 by the load distribution system 35 after the disconnection.

The function of automatic load distribution when operating in the part-load operational range or in the case of defective rectifier modules 8 or defective inverter modules 9 is shown in FIG. 4 by a dashed line.

The rectifier modules 8 and inverter modules 9 each have data interfaces, which are configured for an exchange of information with each other as well as with the main computer 34.

The data interfaces are digital data interfaces. In this regard, each rectifier module 8 and inverter module 9 is assigned an address.

FIG. 5 shows a schematic representation of a rectifier module 8 and an inverter module 9. The left part of the diagram shows a strongly simplified representation of the rectifier module 8 in a first changing position 16. This rectifier module 8 may have a first plug 28 on its rectifier module output side 22. Moreover, the rectifier module 8 may be equipped with a first quick-release connector 12 on its bottom side. This first quick-release connector 12, however, may also be arranged on other and/or multiple locations on the rectifier module 8.

In the base frame 3, a first mating plug 30 connected to the cable system 4 in an electrically conductive manner as well as a first quick-release connector receiving element 14 may be formed. In this regard, the first mating plug 30 is arranged, for example, in the region of a first receiving recess 31 on the base frame 3. When moving the rectifier module 8 from the first changing position 16 into the first operating position 10, an automatic engagement of the first quick-release connector 12 with the first quick-release connector receiving element 14 may occur. In this diagram shown, the engagement is effected by means of a first spring element 36 in the first quick-release connector 12, however, other mechanisms are also conceivable. For example, the locking may be effected by turning a lever, wherein this turning may preferably occur without the use of tools.

By transferring the rectifier module 8 into the first operating position 10, moreover, the first plug 28 and the first mating plug 30 can be automatically connected in an electrically conductive manner.

The first mating plug 30 may be coupled to an intermediate circuit conductor 24 by means of a cable system 4 in the form of a circuit board 5 or also in the form of a cable harness 6. This intermediate circuit conductor 24 may, in turn, be connected to a second mating plug 32, wherein said second mating plug 32 may be positioned in a second receiving recess 33.

The further design is preferably essentially structurally identical to the rectifier module 8 described above. When producing the second operating position 11, the second mating plug 32 may be connected to a second plug 29 in an electrically conductive manner by the inverter module 9 being moved out of a second changing position 17 into said second operating position 11. This second plug 29 may, in this regard, be provided at the inverter module input side 25 of the inverter module 9. Identically to the rectifier module 8, the inverter module 9 has a second quick-release connector 13 due to its identical design. Furthermore, a second quick-release connector receiving element 15 is provided on the base frame 3. When moving the rectifier module 8 from the second changing position 17 into the second operating position 11, an automatic engagement of the second quick-release connector 13 with the second quick-release connector receiving element 15 may occur. In this diagram shown, the engagement is effected by means of a second spring element 37 in the second quick-release connector 13, however, other mechanisms are conceivable here, as well. By transferring the rectifier module 8 into the second operating position 11, moreover, the second plug 29 and the second mating plug 32 can be automatically connected in an electrically conductive manner.

Moreover, it is conceivable that both the rectifier module 8 and the inverter module 9 are equipped with a first and a second discharging device 38, 39 via the first and/or second mating plug 30, 32. If the rectifier module 8 or inverter module 9 are transferred from the operating position 10, 11 into the changing position 16, 17, the stored electrical energy is automatically discharged.

The rectifier modules 8 may be equipped with an active power factor correction filter. In particular, the rectifier modules 8 and inverter modules 9 serve to convert a three-phase input alternating voltage 21 into a three-phase output alternating voltage 27. Preferably a three-phase input alternating voltage 21 of 3×400 V/50 Hz, 3×480 V/60 Hz, 960 V/50 Hz, or 690 V/50 Hz is DC converted into a three-phase output alternating voltage 27 of 3×200 V/400 Hz or into an output direct voltage of 28 V DC or 270 V DC.

FIG. 5 moreover also shows that the intermediate circuit conductor 24 may be coupled to a parallel input 18, by means of which additional direct current power sources 19, such as batteries and accumulators, can be integrated.

Additionally, it may be useful if the rectifier modules 8 and inverter modules 9 have data interfaces, which are configured for the exchange of information with each other and/or with a main computer 34. The data interfaces are, in particular, are digital data interfaces.

The exemplary embodiments show possible embodiment variants, and it should be noted in this respect that the invention is not restricted to these particular illustrated embodiment variants of it, but that rather also various combinations of the individual embodiment variants are possible and that this possibility of variation owing to the technical teaching provided by the present invention lies within the ability of the person skilled in the art in this technical field.

The scope of protection is determined by the claims. Nevertheless, the description and drawings are to be used for construing the claims. Individual features or feature combinations from the different exemplary embodiments shown and described may represent independent inventive solutions. The object underlying the independent inventive solutions may be gathered from the description.

All indications regarding ranges of values in the present description are to be understood such that these also comprise random and all partial ranges from it, for example, the indication 1 to 10 is to be understood such that it comprises all partial ranges based on the lower limit 1 and the upper limit 10, i.e. all partial ranges start with a lower limit of 1 or larger and end with an upper limit of 10 or less, for example 1 through 1.7, or 3.2 through 8.1, or 5.5 through 10.

Finally, as a matter of form, it should be noted that for ease of understanding of the structure, elements are partially not depicted to scale and/or are enlarged and/or are reduced in size.

| List of reference numbers | |
|---|---|
| 1 | Ground power unit |
| 2 | Protective cover |
| 3 | Base frame |
| 4 | Cable system |
| 5 | Circuit board |
| 6 | Cable harness |
| 7 | Ground contact area |
| 8 | Rectifier module |
| 9 | Inverter module |
| 10 | First operating position |
| 11 | Second operating position |
| 12 | First quick-release connector |
| 13 | Second quick-release connector |
| 14 | First quick-release connector receiving element |
| 15 | Second quick-release connector receiving element |
| 16 | First changing position |
| 17 | Second changing position |
| 18 | Parallel input |
| 19 | Direct current power source |
| 20 | Rectifier module input side |
| 21 | Input alternating voltage |
| 22 | Rectifier module output side |
| 23 | Intermediate direct voltage |
| 24 | Intermediate circuit conductor |
| 25 | Inverter module input side |
| 26 | Inverter module output side |
| 27 | Output alternating voltage |
| 28 | First plug |
| 29 | Second plug |
| 30 | First mating plug |
| 31 | First receiving recess |
| 32 | Second mating plug |
| 33 | Second receiving recess |
| 34 | Main computer |
| 35 | Load distribution system |
| 36 | First spring element |

| | List of reference numbers |
|---|---|
| 37 | Second spring element |
| 38 | First discharging device |
| 39 | Second discharging device |

The invention claimed is:

1. A ground power unit for providing electrical energy for aircraft, the ground power unit comprising:
   a main computer comprising a load distribution system;
   a base frame;
   a cable system, which is formed in the base frame;
   a first rectifier module for converting an input alternating voltage applied to a rectifier module input side into an intermediate direct voltage output at a rectifier module output side, wherein the rectifier module output side is coupled to an intermediate circuit conductor;
   a first inverter module for converting the intermediate direct voltage applied to an inverter module input side into an output alternating current which is output at an inverter module output side, wherein the inverter module input side is coupled to the intermediate circuit conductor;
   wherein the first rectifier module and the first inverter module are each realized as units formed to be structurally independent, which can be replaced individually and independently of the base frame, and
   a second rectifier module electrically connected in parallel with the first rectifier module, the first rectifier module and the second rectifier module each having a data interface, wherein the data interface is configured for the exchange of information with each other rectifier module and with the load distribution system, wherein the load distribution system is configured to carry out a load distribution between the first rectifier module and the second rectifier module based on the exchanged information, and
   a second inverter module electrically connected in parallel with the first inverter module, the first inverter module and the second inverter module each having a data interface, wherein the data interface is configured for the exchange of information with each other inverter module and with the load distribution system,
   wherein the load distribution system is configured to carry out in an automated manner a load distribution between the first inverter module and the second inverter module.

2. The ground power unit according to claim 1, wherein the first rectifier module and the first inverter module have the same structural design, wherein the first rectifier module and the first inverter module are coupled to the cable system in a mirrored manner as viewed in the direction of the electric flow.

3. The ground power unit according to claim 1, wherein the first rectifier module and the first inverter module each have at least one plug, each of which is coupled to a mating plug connected to the cable system in an electrically conductive manner.

4. The ground power unit according to claim 3, wherein the plug is arranged on the first rectifier module and/or on the first inverter module, and the mating plug is arranged in the region of a receiving recess on the base frame, such that in an operating position of the first rectifier module and/or of the first inverter module, an electrically conductive connection between the plug and the mating plug is established.

5. The ground power unit according to claim 1, wherein the first rectifier module and the first inverter module have a quick-release connector, which is designed such that the quick-release connector engages with a quick-release connector receiving element in the base frame and/or locks automatically upon transfer into the operating position.

6. The ground power unit according to claim 1, wherein the first rectifier module and the first inverter module are positioned at a height of 0.5 m to 2.0 m with respect to a ground contact area of the base frame.

7. The ground power unit according to claim 1, wherein the first rectifier module and the first inverter module are each installed on just one circuit board.

8. The ground power unit according to claim 1,
   further comprising a plurality of rectifier modules connected in parallel with one another wherein at least one of the plurality of rectifier modules connected in parallel with one another can be disconnected in the part-load operational range; and/or
   further comprising a plurality of inverter modules connected in parallel with one another wherein at least one of the plurality of inverter modules connected in parallel with one another can be disconnected in the part-load operational range.

9. The ground power unit according to claim 1, wherein the data interface is a digital data interface, and wherein both the first rectifier module and the first inverter module are each assigned an address or can be assigned an address.

10. The ground power unit according to claim 1, wherein the intermediate circuit conductor is coupled to a parallel input, by means of which additional direct current power sources can be integrated into the intermediate circuit conductor.

11. The ground power unit according to claim 4, wherein a discharging device is formed and arranged in the base frame and/or in the first rectifier module and/or in the first inverter module such that, upon transfer from the operating position into a changing position, the electrical energy stored in the first rectifier module and/or in the inverter module is automatically discharged.

12. A method for maintaining and operating a ground power unit for providing electrical energy for aircraft, the ground power unit comprising:
   a base frame;
   a cable system, which is formed in the base frame;
   a plurality of rectifier modules, each rectifier module of the plurality of rectifier modules being configured for converting an input alternating voltage applied to a rectifier module input side into an intermediate direct voltage output at a rectifier module output side, wherein the rectifier module output side is coupled to an intermediate circuit conductor;
   a plurality of inverter modules, each inverter module of the plurality of inverter modules being configured for converting the intermediate direct voltage applied to an inverter module input side into an output alternating current which is output at an inverter module output side, wherein the inverter module input side is coupled to the intermediate circuit conductor;
   wherein each rectifier module of the plurality of rectifier modules and each inverter module of the plurality of inverter modules is realized as a unit formed to be structurally independent, which are replaced individually and independently of the base frame;
   wherein each rectifier module of the plurality of rectifier modules and each inverter module of the plurality of inverter modules have a data interface, wherein the data interface is configured for the exchange of information with each other rectifier module and with each other inverter module and a main computer;

wherein the method comprises the following method steps:

coupling each rectifier module of the plurality of rectifier modules to the main computer and replacing a defective rectifier module of the plurality of rectifier modules with a replacement rectifier module, wherein the main computer disconnects the defective rectifier module prior to replacement of the defective rectifier module and adjusts the load distribution to the rectifier modules remaining after replacement of the defective rectifier module and coupling each inverter module of the plurality of inverter modules to the main computer and replacing a defective inverter module of the plurality of inverter modules with a replacement inverter module, wherein the main computer disconnects the defective inverter module prior to replacement of the defective inverter module and adjusts the load distribution to the inverter modules remaining after replacement of the defective inverter module.

13. The method according to claim 12, wherein the defective rectifier module and/or the defective inverter module is disconnected in the part-load operational range.

* * * * *